US008339805B2

(12) United States Patent
Fukushima

(10) Patent No.: US 8,339,805 B2

(45) Date of Patent: Dec. 25, 2012

(54) CIRCUIT BOARD HOLDING MEMBER AND IMAGE FORMING APPARATUS

(75) Inventor: Takaaki Fukushima, Saitama (JP)

(73) Assignee: Fuji Xerox Co., Ltd., Tokyo (JP)

( * ) Notice: Subject to any disclaimer, the term of this patent is extended or adjusted under 35 U.S.C. 154(b) by 322 days.

(21) Appl. No.: 12/731,716

(22) Filed: Mar. 25, 2010

(65) Prior Publication Data

US 2011/0051377 A1 Mar. 3, 2011

(30) Foreign Application Priority Data

Aug. 31, 2009 (JP) ................................ 2009-199849

(51) Int. Cl.
*H05K 7/02* (2006.01)
*H05K 7/04* (2006.01)

(52) U.S. Cl. ......................... 361/807; 361/809; 361/810

(58) Field of Classification Search .................. 361/721, 361/760, 807, 810, 809
See application file for complete search history.

(56) References Cited

U.S. PATENT DOCUMENTS 4,850,657 A * 7/1989 Placke et al. ............ 361/679.43
4,974,121 A * 11/1990 Masuko et al. ............... 361/826
5,552,967 A * 9/1996 Seto et al. ..................... 361/818
5,847,934 A * 12/1998 Yasuda ......................... 361/753
6,343,020 B1 * 1/2002 Lin et al. ....................... 361/816
7,236,374 B2 * 6/2007 Hirao ........................... 361/825

FOREIGN PATENT DOCUMENTS

JP A-2006-309058 11/2006
JP A-2008-294272 12/2008

* cited by examiner

*Primary Examiner* — Hung S Bui
(74) *Attorney, Agent, or Firm* — Oliff & Berridge, PLC

(57) ABSTRACT

A circuit board holding member includes a body portion, holding portions and first attachment portions. The body portion is made of resin, and is provided to hold a circuit board. The holding portions are made of resin. The holding portions are formed integrally with the body portion, and are provided to hold connection lines to be connected from electric modules of an apparatus to the circuit board. The first attachment portions are provided in the body portion and serve for removably attaching the circuit board to the apparatus.

15 Claims, 5 Drawing Sheets

CIRCUIT BOARD HOLDING MEMBER AND IMAGE FORMING APPARATUS

CROSS-REFERENCE TO RELATED APPLICATION

This application is based on and claims priority under 35 USC119 from Japanese Patent Application No. 2009-199849 filed on Aug. 31, 2009.

BACKGROUND

1. Technical Field

The present invention relates to a circuit board holding member for holding a circuit board and attaching the circuit board to an apparatus, and an image forming apparatus provided with the circuit board holding member.

2. Related Art

For example, inside various image forming apparatus (including copying machines, printers, facsimile machines, complex machines of these, etc.), a large number of harnesses are generally put around from a circuit board to electric modules. Considerations should be given to the harnesses as to whether the harnesses can be collected efficiently without being damaged, whether maintenancability can be secured, and so on.

SUMMARY

A circuit board holding member includes a body portion, holding portions and first attachment portions. The body portion is made of resin, and is provided to hold a circuit board. The holding portions are made of resin. The holding portions are formed integrally with the body portion, and are provided to hold connection lines to be connected from electric modules of an apparatus to the circuit board. The first attachment portions are provided in the body portion and serve for removably attaching the circuit board to the apparatus.

BRIEF DESCRIPTION OF THE DRAWINGS

Exemplary embodiments of the invention will be described in detail based on the following figures, wherein.

DETAILED DESCRIPTION

An embodiment of the invention will be described below with reference to the drawings.

Figure 1:
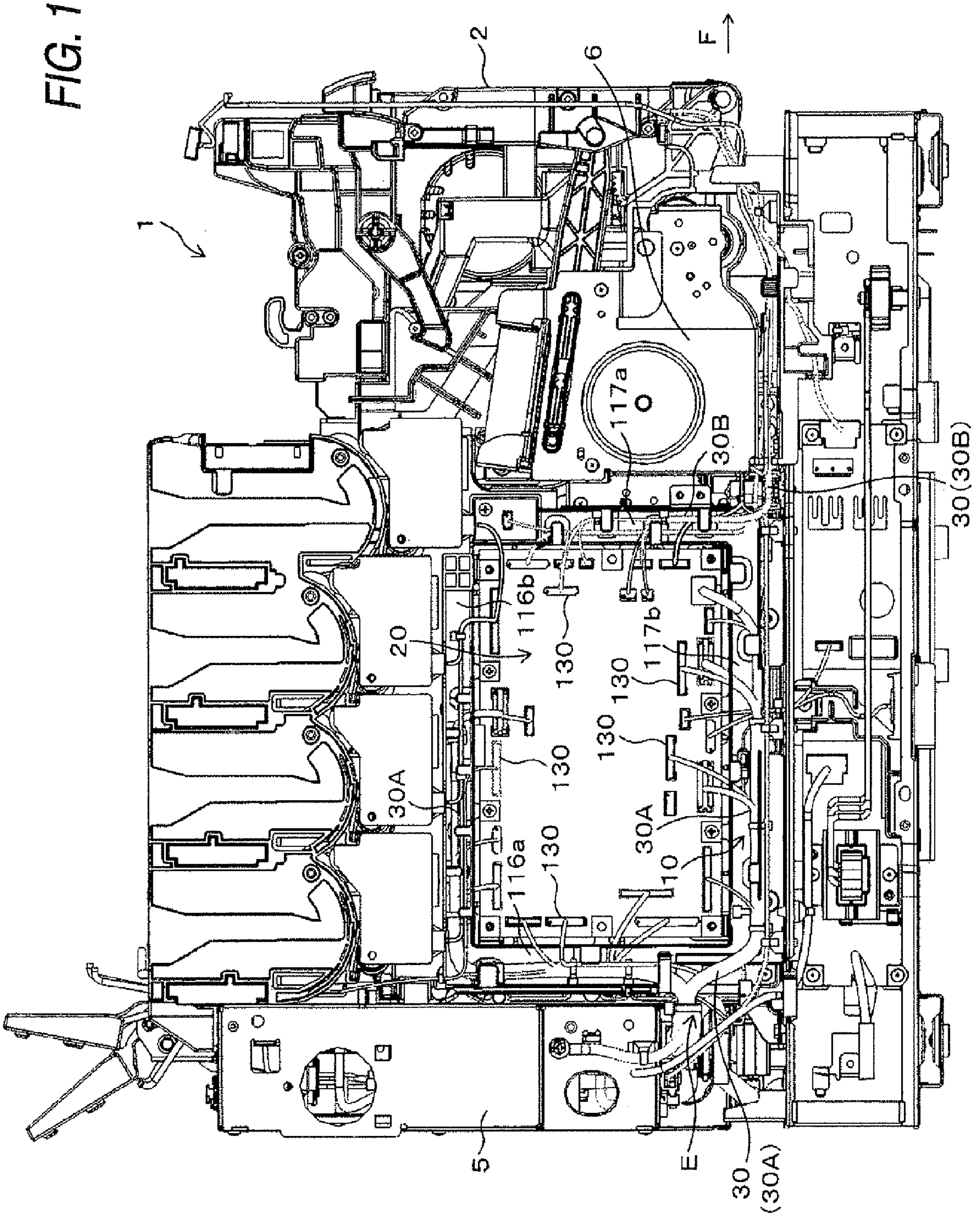
FIG. 1 is a side view showing an internal structure of a printer provided with a circuit board holding member according to an embodiment of the invention.

FIG. 1 is a view in which the internal structure of a printer 1 serving as an image forming apparatus and having a circuit board holding member (hereinafter referred to as "holding member") 10 according to an embodiment attached thereto is viewed from one side. The printer 1 has a full-color image forming portion received in an apparatus body 2. A paper cassette is inserted into a paper cassette receiving space from the front depicted by the arrow F in FIG. 1. The paper cassette receiving space is provided in a lower portion of the printer 1. Paper sheets are extracted one by one from the paper cassette, and a color image is formed on each sheet by the image forming portion.

The printer 1 has electric modules including a power supply board 5 which is fixed to a rear portion of the apparatus body 2 and a power feed unit 6 which is fixed to a front portion of the apparatus body 2. The printer 1 also has various other electric modules. A large number of harnesses (connection lines) 30 extending from the electric modules are connected to a circuit board 20 of a control system attached to a side surface of the apparatus body 2.

Figure 2:
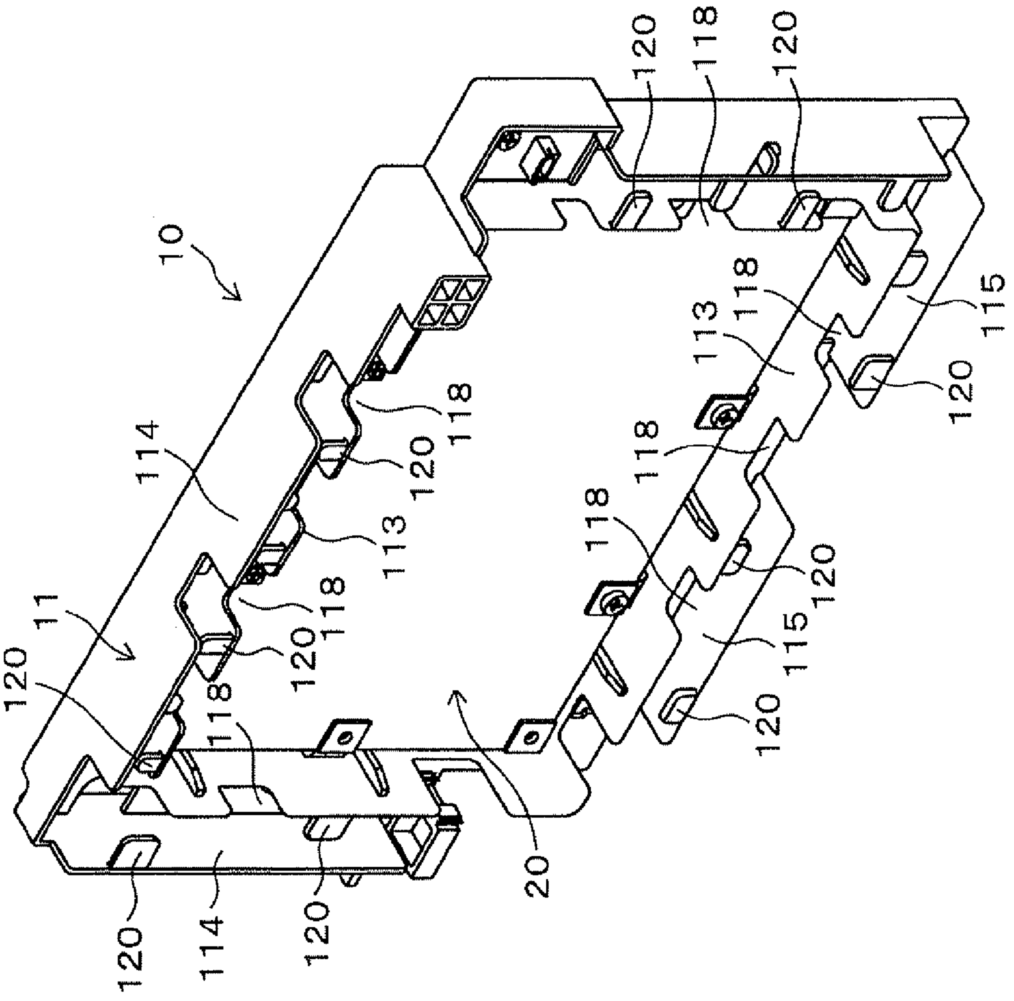
FIG. 2 is a perspective view of the circuit board holding member according to the embodiment.
Figure 3:
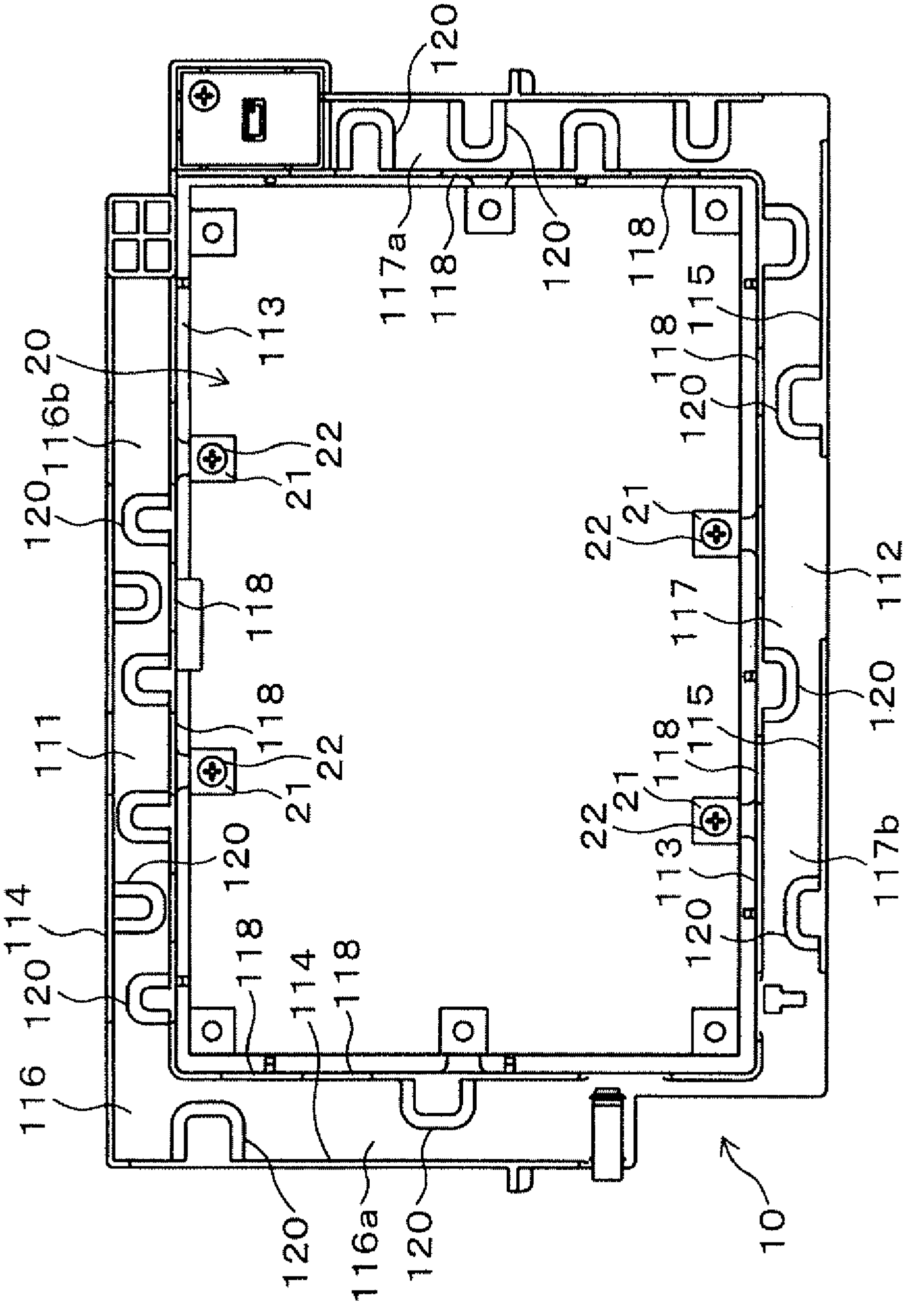
FIG. 3 is a front view of the circuit board holding member.

The circuit board 20 is held by the holding member 10. As shown in FIGS. 2 and 3, the holding member 10 has a body portion 11 as its main part. The body portion 11 is formed out of resin and molded into a rectangular frame-like shape. The circuit board 20 which has a rectangular shape is fitted into a space inside the body portion 11 so as to be held therein.

The body portion 11 of the holding member 10 is formed by resin molding. The body portion 11 has a rectangular frame-like shape as a whole, having two L-shaped flat plate portions, that is, a first flat plate portion 111 and a second flat plate portion 112, which are formed to face each other. At the rectangular inner edge of the body portion 111, inside ribs 113 standing erectly with respect to the body portion 11 are formed integrally.

At the outer edge of the first flat plate portion 111, outside ribs 114 are formed all over the length. On the other hand, a plurality (two in this case) outside ribs 115 are formed in predetermined places at the outer edge of the second flat plate portion 112. The outside ribs 114 and 115 are formed in opposition to the inside ribs 113 and in parallel to the inside ribs 113. In the respective flat plate portions 111 and 112, the inside ribs 113 and the outside ribs 114 and 115 formed on the opposite sides in the longitudinal direction are formed like grooves. Harnesses 30 can be led into and disposed in these thus formed groove portions 116 and 117.

A plurality of clamps (holding portions) 120 for holding the harnesses 30 are formed in the inside ribs 113 and the outside ribs 114 and 115. The clamps 120 are made of resin molded integrally with the body portion 11. Each clamp 120 protrudes outward to across each flat plate portion 111, 112. The protruding directions of the clamps 120 are set to be reverse alternatively along the length direction of each groove portion 116, 117. Each clamp 120 is elastic enough to elastically press and hold the harnesses 30 put between the clamp 120 and each fiat portion 111, 112.

Figure 4:
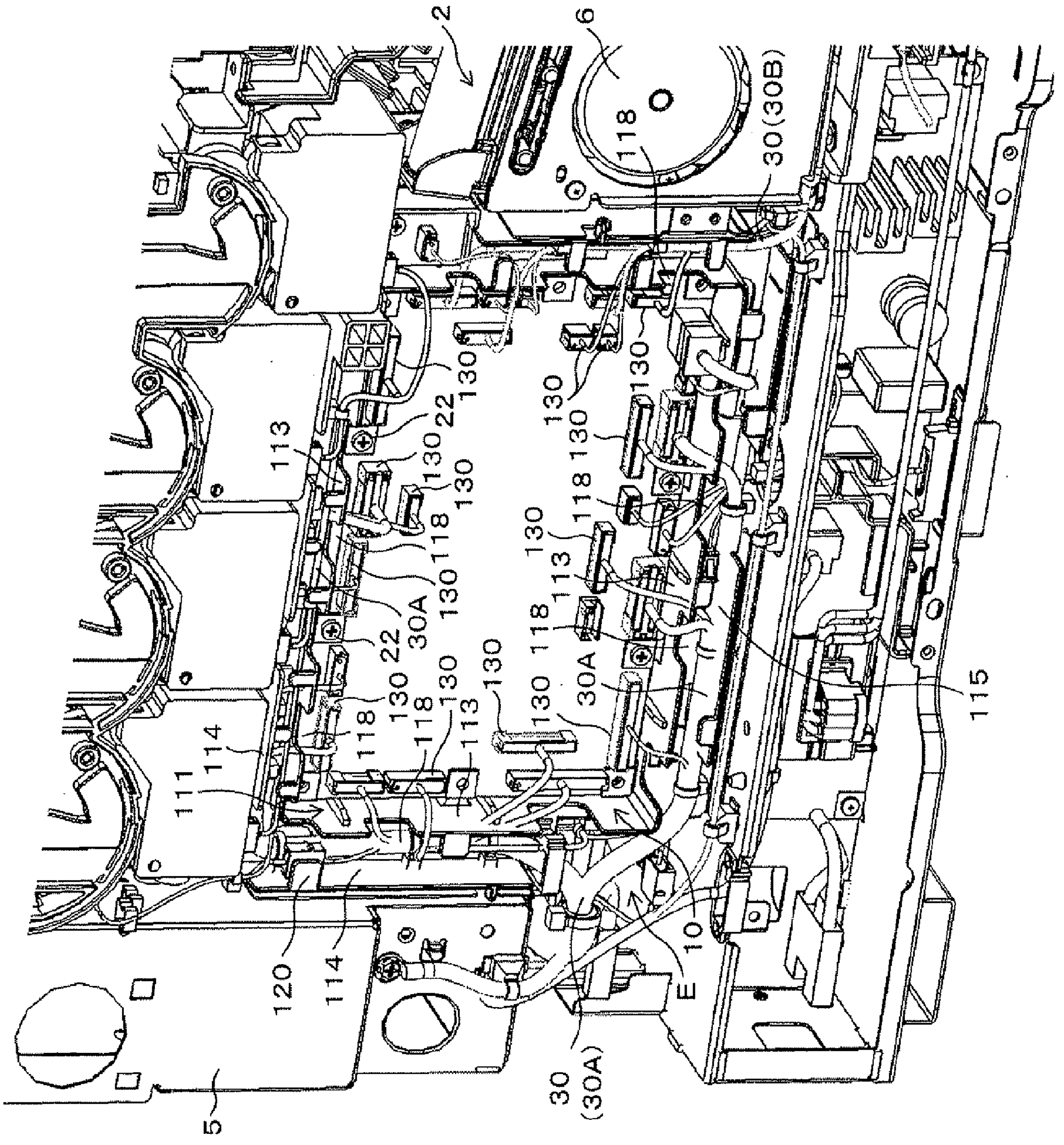
FIG. 4 is a perspective view showing the circuit board holding member attached to the printer.

As shown in FIG. 4, connectors 130 to which the harnesses 30 are connected are provided near the four side edges of the circuit board 20. A plurality of notches 118 into which the harnesses 30 are led are formed in places of the inside ribs 113 corresponding to the connectors 130, respectively. These notches 118 are formed in such a manner that one notch 118 corresponds to a plurality of connectors 130. In addition, screw passage portions 21 provided with a plurality of screw holes are provided in the circuit board 20 so that screws 22 screwed down to the apparatus body 2 are inserted into the screw passage portions 21.

Figure 5:
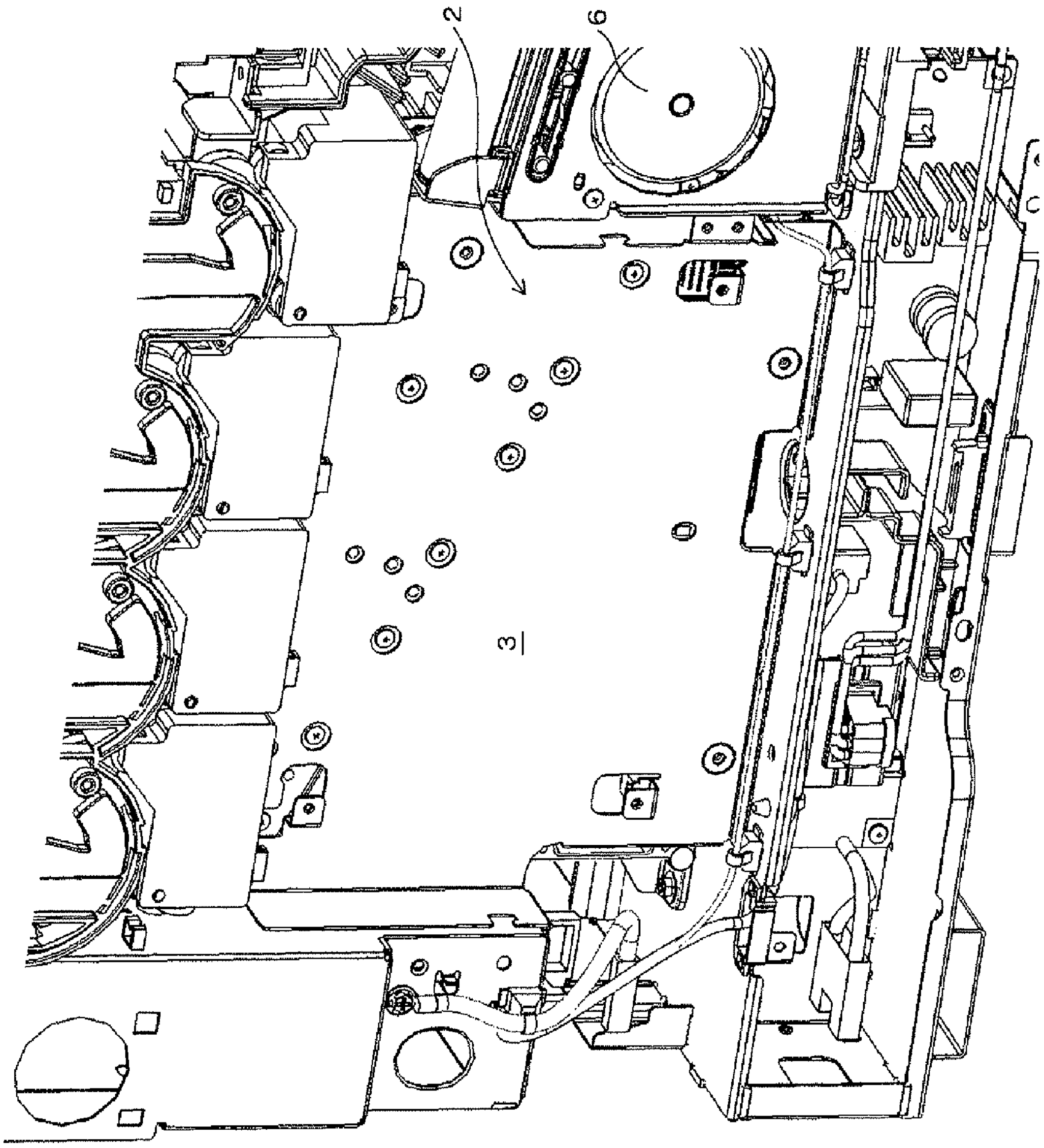
FIG. 5 is a perspective view showing a state where the circuit board holding member has been removed from the printer.

As shown in FIG. 4, the holding member 10 holding the circuit board 20 is fitted into a board setting portion 3 (see FIG. 5) formed in one side of the apparatus body 2. The screws 22 inserted into the screw passage portions 21 of the circuit board 20 are screwed down to screw holes provided in the board setting portion 3 so that the holding member 10 is fixed to the apparatus body 2. Through the screws 22, the circuit board 20 is grounded directly to the apparatus body 2.

A plurality of rear-side harnesses 30A and a plurality of front-side harnesses 30B are connected to the circuit board 20 held by the holding member 10. One end of each rear-side harness 30A is connected to a rear-side electric module including the aforementioned power supply board 5, while one end of each front-side harness 30B is connected to a front-side electric module including the aforementioned power feed unit 6.

The rear-side harnesses 30A are put near the lower left corner portion of the holding member 10 in FIG. 1. The rear-side harnesses 30A are separated into branches in the corner portion. One branch extends on the first flat plate portion 111 side to be put in between a rear-side groove portion 116*a* and an upper-side groove portion 116*b*. The other branch is put in a lower-side groove portion 117*b*. Those branches are retained by the clamps 120. A plurality of front end portions branched from the rear-side harnesses 30A are led into a notch 118, put across an inside rib 113 and connected to connectors 130 close to and corresponding to the inside rib 113.

On the other hand, the front-side harnesses 30B are put near the lower right corner portion of the holding member 10 in FIG. 1. The front-side harnesses 30B extending from the corner portion are led into a front-side groove portion 117*a* on the second flat plate portion 112 side, and retained by the clamps 120. Parts of a plurality of front end portions branched from the front-side harnesses 30B are inserted into a notch 118, put across an inside rib 113 and connected to connectors 130 close to and corresponding to the inside rib 113.

Assume that the circuit board 20 is removed from the apparatus body 2 and maintenance is performed on the inside of the printer 1. In this case, according to the embodiment, the screws 22 are removed and the circuit board 20 is removed together with the holding member 10. On this occasion, the front-side harnesses 30B are removed from the connectors 130, but the rear-side harnesses 30A are not removed from the connectors 130. In such a state, the circuit board 20 and the holding member 10 can be removed from the apparatus body 2 when they are turned over using the vicinity of the branching portion (designated by the reference sign E in FIGS. 1 and 4) of the rear-side harnesses 30A as a fulcrum.

Thus, the circuit board 20 can be removed from the apparatus body 2 without removing all the harnesses 30 connected to the circuit board 20. As a result, labor can be saved at the time of maintenance inside the apparatus body 2. Thus, the maintenance becomes easy. In addition, the work to remove a large number of harnesses 30 from the electric modules on the apparatus body 2 side becomes unnecessary. Thus, the maintenance can be performed even in a narrow working space while workability can be prevented from deteriorating.

In addition, since the holding member 10 is entirely made of resin, the clamps 120 can be integrally molded easily, while the degree of freedom as to the shapes of the clamps 120 can be improved and weight reduction can be attained. Further, it is possible to avoid the fear that the harnesses 30 may be damaged as in the case of clamps made of sheet metal.

If the body portion 11 made of resin were attached to the apparatus body 2 by screws or the like, other members such as grounding springs for grounding the circuit board 20 to the apparatus body 2 would be required. However, according to the embodiment, the circuit board 20 and the holding member 10 are attached directly to the apparatus body 2 through the screws 22 which also serve for grounding. Accordingly, attachment and grounding can be achieved by the screws 22. Thus, grounding can be performed easily while the structure can be simplified.

In addition, since the circuit board 20 is held inside the rectangular body portion 11, the circuit board 20 can be held surely and firmly by the body portion 11. Rigidity can be secured in the body portion 11 because the inside ribs 113 and the outside ribs 114 and 115 are formed in the body portion 11. Thus, the body portion 11 integrated with the circuit board 20 can be handled easily, while spaces to place the harnesses 30 can be secured between the inside and outside ribs. Further, when the harnesses 30 are led into the notches 118 of the inside ribs 113, the harnesses 30 can be retained. Further, the harnesses 30 can be prevented from protruding, so that increase in the total thickness can be suppressed.

Preferably the harnesses 30 are configured to be removably connected to various electric modules in the apparatus body 2 through relay connectors respectively. According to this configuration, there is an advantage that even in the circumferences where the circuit board 20 restrained by the harnesses 30 can be hardly removed from the apparatus, the circuit board 20 can be removed from the apparatus body 2 easily when the harnesses 30 are removed from the relay connectors.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A circuit board holding member comprising:

a body portion that is made of resin and that is provided to hold a circuit board;

holding portions that (i) are made of resin, (ii) are formed integrally with the body portion, and (iii) are provided to hold connection lines to be connected from electric modules of an apparatus to the circuit board; and first attachment portions that are provided in the body portion and that serve for removably attaching the circuit board to the apparatus, wherein the connection lines include one side connection line and an other side connection line, and the first attachment portions are provided to be removed from the body portion without removing one of the one side connection line or the other side connection line which is connected to the body portion.

2. The circuit board holding member according to claim 1, further comprising:

second attachment portions that are provided in the circuit board held by the body portion and that serve for removably attaching the circuit board to the apparatus.

3. The circuit board holding member according to claim 2, wherein when the second attachment portions are provided in the circuit board, the circuit board is grounded to the apparatus through the second attachment portions.

4. The circuit board holding member according to claim 1, wherein the connection lines are removably connected to the electric modules through relay connectors.

5. The circuit board holding member according to claim 1, wherein the circuit board is formed into a rectangular shape, connectors to which the connection lines are connected are provided near four side edges of the circuit board, and the body portion is formed into a rectangular shape which surrounds the circuit board.

6. The circuit board holding member according to claim 5, wherein outside ribs are formed at an outer edge of the body portion.

7. The circuit board holding member according to claim 5, wherein inside ribs are formed at an inner edge of the body portion, and notches into which the connection lines are led are formed in places of the inside ribs corresponding to the connectors.

8. An image forming apparatus comprising:

the circuit board holding member according to claim 1; and the circuit board.

9. An electric apparatus comprising:

a circuit board that includes attachment portions; and a circuit board holding member that includes:

a body portion which is made of resin and which is provided to hold a circuit board; and holding portions which (i) are made of resin, (ii) are formed integrally with the body portion, and (iii) are provided to hold connection lines to be connected from electric modules of an apparatus to the circuit board, wherein the attachment portions are provided in the circuit board held by the body portion and serve for removably attaching the circuit board to the apparatus, the connection lines include one side connection line and an other side connection line, and the attachment portions are provided to be removed from the body portion without removing one of the one side connection line or the other side connection line which is connected to the body portion.

10. The electric apparatus according to claim 9, wherein when the attachment portions are provided in the circuit board, the circuit board is grounded to the apparatus through the attachment portions.

11. The electric apparatus according to claim 9, wherein the connection lines are removably connected to the electric modules through relay connectors.

12. The electric apparatus according to claim 9, wherein the circuit board is formed into a rectangular shape, connectors to which the connection lines are connected are provided near four side edges of the circuit board, and the body portion is formed into a rectangular shape which surrounds the circuit board.

13. The electric apparatus according to claim 12, wherein outside ribs are formed at an outer edge of the body portion.

14. The electric apparatus according to claim 12, wherein inside ribs are formed at an inner edge of the body portion, and notches into which the connection lines are led are formed in places of the inside ribs corresponding to the connectors.

15. An image forming apparatus comprising:

the circuit board holding member according to claim 9; and the circuit board according to claim 9.

* * * * *